United States Patent

Marx et al.

[11] Patent Number: 5,880,485
[45] Date of Patent: Mar. 9, 1999

[54] SEMICONDUCTOR DEVICE INCLUDING GALLIUM NITRIDE LAYER

[75] Inventors: Diethard Marx, Osaka; Zempei Kawazu; Yutaka Mihashi, both of Tokyo, all of Japan

[73] Assignee: Mitsubishi Denki Kabushiki Kaisha, Tokyo, Japan

[21] Appl. No.: 927,692

[22] Filed: Sep. 11, 1997

[30] Foreign Application Priority Data

Mar. 24, 1997 [JP] Japan ..................... 9-069703

[51] Int. Cl.$^6$ ..................... H01L 33/00
[52] U.S. Cl. ............. 257/94; 257/76; 257/201; 257/615; 372/45
[58] Field of Search ................. 257/22, 76, 94, 257/200, 201, 615; 252/623 GA; 372/45

[56] References Cited

U.S. PATENT DOCUMENTS

| | | | |
|---|---|---|---|
| 4,077,817 | 3/1978 | Bellavance | 148/171 |
| 5,122,845 | 6/1992 | Manabe et al. | 357/17 |
| 5,218,216 | 6/1993 | Manabe et al. | 257/103 |
| 5,741,360 | 4/1998 | Goto et al. | 117/94 |
| 5,795,798 | 8/1998 | Mishra et al. | 438/35 |

FOREIGN PATENT DOCUMENTS 8222812  8/1996  Japan .

OTHER PUBLICATIONS

Kato et al., "Selective Growth Of Murtzite GaN And $Al_xGa_{1-x}N$ On GaN/Sapphire Substrates By Metalorganic Vapor Phase Epitaxy", Journal of Crystal Growth, Vol. 144, 1994, pp. 133–140.

Redwing et al., "Optically Pumped Vertical Cavity Surface Emittine Laser Operation In GaN–AlGaN Heterostructures", International Symposium on Blue Laser and Light Emitting Diodes, Mar. 1996, pp. 267–270.

*Primary Examiner*—Sara Crane
*Attorney, Agent, or Firm*—Leydig, Voit & Mayer

[57] ABSTRACT

A high-quality gallium nitride layer is grown on a surface of a substrate which is exposed through a dielectric mask on the substrate. The high-quality gallium nitride layer has a composition expressed by the chemical formula:

$$Ga_xAl_yIn_zN \qquad (I)$$

wherein $0<x\leq 1$, $0\leq y<1$, $0\leq z<1$, and $x+y+z=1$. An aluminum nitride thin layer is interposed between neighboring pairs of gallium nitride selectively grown layers and has a composition expressed by the following chemical formula:

$$Al_xGa_{1-x}N \qquad (II)$$

wherein $0.7<x\leq 1$.

8 Claims, 9 Drawing Sheets

Fig. 8A Layer structure
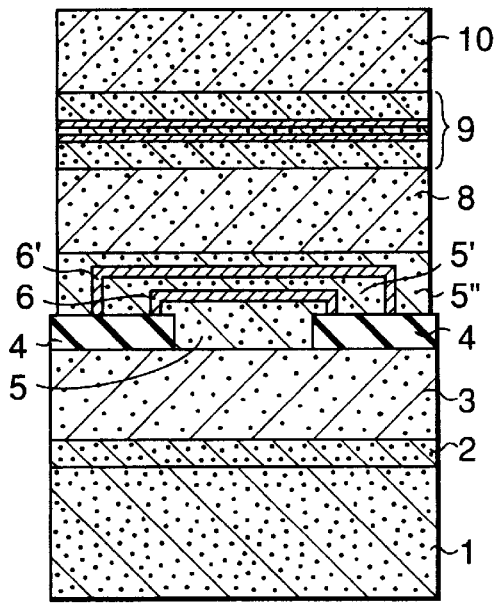
Fig. 8B Laser Ridge definition by Lithography and Dry Etching Process
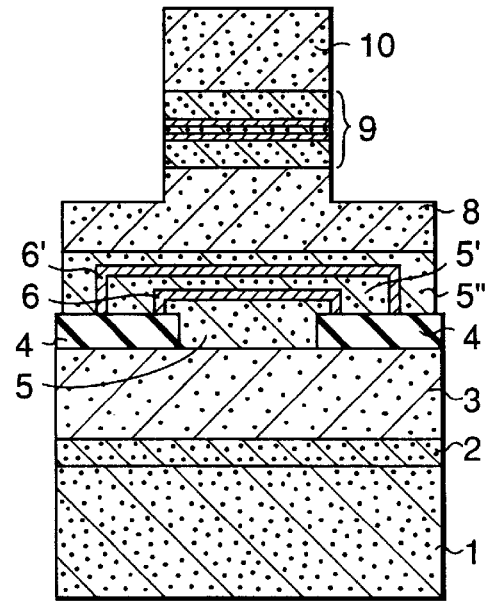
Fig. 8C Index Guiding Laser by Lithography
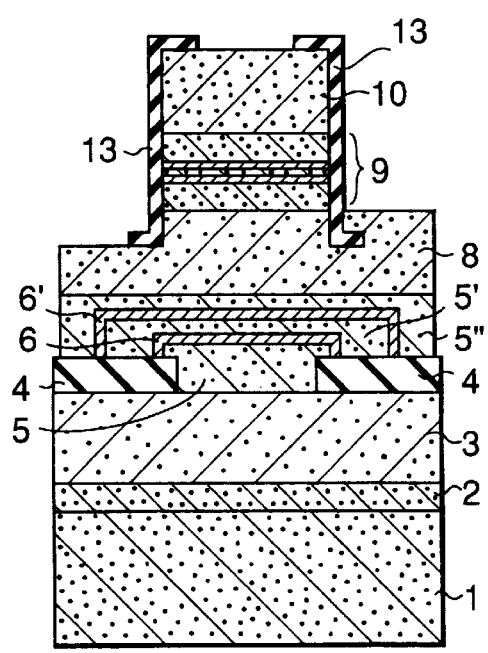
Fig. 8D Metal contact definition by Lithography
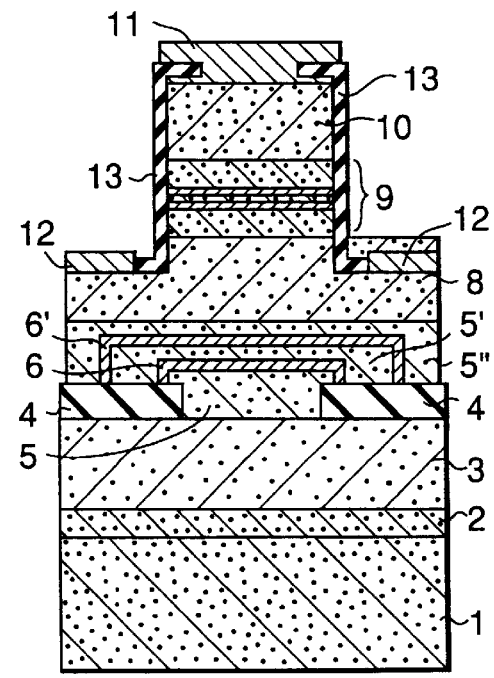

SEMICONDUCTOR DEVICE INCLUDING GALLIUM NITRIDE LAYER

BACKGROUND OF THE INVENTION

1. Field of the Invention

The present invention relates to a high-quality gallium nitride layer-structure provided with a flat surface and a very low dislocation density selectively grown on a semiconductor substrate and a method of selectively growing the layer on the substrate.

2. Description of the Prior Art

Only few data are available on the selective growth of GaN. Therefore, there have been required information on, how the crystalline quality of GaN can be improved drastically using selective growth and a suitable layer structure.

The first study to our best knowledge was given by Y. Kato et al. (J. Crystal Growth 144 (1994) 133). They used GaN layers for patterning with a $SiO_2$ mask as shown in FIG. 12A. The substrate 18 was sapphire (11$\bar{2}$0), 18, followed by a buffer layer of AlN 19, and a 2 μm thick GaN crystal layer 20. Then a 100 nm thick $SiO_2$ layer 21 was sputtered and stripes opened by a lithography and etching process. FIGS. 12B to 12F show processes of the successive growth of GaN on the mask in a cross sectional view. As can be seen, first a rough surface occurs in FIG. 12B, which finally closes to the triangular form 22 given in FIG. 12F,. In all cases, the selectively grown GaN did not grow in a layer by layer mode, and thus the growth mode is not suitable for the growth of device structures.

A more recent result on GaN selective growth was given by T. Tanaka et al (TWN 1995 conference, Nagoya, Sep. 21, 1995). They tried to deposit GaN directly on sapphire substrates. Depending on the surface treatment condition (nitridization in ammonia or not) and growth temperature, they could obtain two different stripe forms. One is of the triangular shape and the other is a rectangular form. In both cases, no data hint to an improved crystal quality, and the quality is expected to be poor due to the missing GaN buffer layer. Furthermore the result shows that the shape strongly depends on substrate treatment, which can cause a problem of reproducibility.

Finally, our own study of selective growth of GaN showed similar problems as in Y. Kato et al. For the experiments, first 2 μm of GaN (including a low temperature GaN layer) was deposited on sapphire, and then a 100 nm $SiO_2$ film was sputtered on the GaN surface. The $SiO_2$ film was partly removed by lithography and wet etching steps. The open areas formed stripes oriented in the (11$\bar{2}$0) direction. After this procedure, the samples were again loaded into the MOCVD apparatus machine. After heating the sample in an ammonia flow to 1130° C. selective growth was initiated by introducing a flow of trimethyl gallium (TMG). In a cross sectional SEM picture, the obtained GaN stripe has a very rough surface morphology.

Therefore, a first object of the present invention is to provide a new method and layer structure which improves GaN crystal line quality drastically.

The method can be applied to many device structures. Therefore, a second object of the present invention is to provide a device formed on the improved gallium nitride, such a laser, UV-detector FET, HFET, HBT, HEMT and so on.

SUMMARY OF THE INVENTION

According to the first aspect of the present invention, there can be provided a method of selectively growing a high-quality gallium nitride layer on a surface area of a substrate which is exposed through a dielectric mask formed on the substrate, the high-quality gallium nitride layer having a composition expressed by the following chemical formula:

$$Ga_xAl_yIn_zN \quad (I)$$

wherein $0<x\leq 1$, $0\leq y<1$, $0\leq z<1$, and $x+y+z=1$, the method comprising a step of alternately growing the gallium nitride selectively grown layer and an aluminum nitride thin layer on the substrate, the aluminum nitride thin layer having a composition expressed by the chemical formula:

$$Al_xGa_{1-x}N \quad (II)$$

wherein $0.7<x\leq 1$.

According to the present invention, with the selective growing method to form the gallium nitride layer of the present invention, the aluminum nitride thin layer, effective to increase the length of migration of the Ga atoms as compared with that of the gallium nitride layer, is suitably interposed between each neighboring gallium nitride layer which is selectively grown to thereby accomplish a flattening of the gallium nitride layer immediately above the aluminum nitride thin layer. Accordingly, not only can the surface irregularities present at the surface of the substrate laminated with the gallium nitride layer be reduced, but also it is possible to obtain the substrate laminated with a gallium nitride layer excellent in surface flatness.

In an embodiment of the present invention, the method may comprise a step of growing a gallium nitride layer on a buffer layer prior to the formation of the dielectric mask on the substrate sp a smoother surface can be obtained.

In the embodiment of the present invention, an aluminum nitride layer may be grown on the substrate or an the gallium nitride layer on the substrate.

In the embodiments, the selectively grown gallium nitride layer has a film thickness within a preferred range of 2 to 1,000 nm. On the other hand, the aluminum nitride thin layer has a film thickness within the preferred range of 1 to 200 nm. Because the inclusion of the 1–200 nm thick AlN layers is effective to dramatically change the mode of growth and also to increase the flatness of a surface of each GaN layer as will be discussed in detail later, the density of defects in the GaN layers is substantially reduced as compared with the prior art growing method.

The substrate may be selected from the group consisting of sapphire, Si, GaAs, heat-resistant glass, SiC and GaN, because such a substrate is advantageous in many aspects, for example, inexpensive and easy to handle.

The method can be applied to a gallium nitride selectively grown layer including a GaN layer while the aluminum nitride thin layer is an AlN layer.

According to the second aspect of the present invention, there can be a substrate laminated with a high-quality gallium nitride layer which comprises:

a substrate;

a dielectric mask formed on the substrate and having a portion of a surface exposed to define an opening;

a plurality of gallium nitride selectively grown layers each grown on a portion of the substrate encompassed by the opening, each gallium nitride selectively grown layer having a composition expressed by the following chemical formula:

$$Ga_xAl_yIn_zN \quad (I)$$

wherein $0 < x \leq 1$, $0 < y < 1$, $0 \leq z < 1$, and $x+y+z=1$; and an aluminum nitride thin layer interposed between the neighboring gallium nitride selectively grown layers, said aluminum nitride thin layer having a composition expressed by the following chemical formula:

$$Al_xGa_{1-x}N \qquad (II)$$

wherein $0.7 < x \leq 1$.

The high-quality gallium nitride layer of the present invention is effective to increase the yield of manufacture of devices to be formed on the substrate laminated with the gallium nitride layer.

In an embodiment of the present invention, a buffer layer and gallium nitride layer formed on the substrate prior to the formation of the dielectric mask, is used as a substrate for the deposition of the high-quality gallium nitride layer. A high quality surface can be obtained.

In the both embodiments, the aluminum nitride thin layer is formed on the substrate or the gallium nitride layer on the substrate.

According to the third aspect of the present invention, there can be a semiconductor device which comprises:

the substrate; and a photoelectric semiconductor element, an electronic semiconductor element or an electro-optical integrated semiconductor element.

Because of the flatness of the surface and the reduced defect density of the substrate laminated with the gallium nitride layer, it is also possible to increase the characteristic and the reliability of elements formed on the substrate.

In an embodiment of the present invention, a photo electric semiconductor element may comprise:

a laser element region having successively deposited on the laminated substrate a stripe-shaped n-type gallium nitride clad layer, a stripe-shaped gallium nitride active layer and a p-type gallium nitride clad layer. It is possible to improve the device characteristic, to increase the lifetime and to lower the threshold current density and the power consumption.

In an another embodiment of the present invention, the photo electric semiconductor element may comprise:

a lower Bragg reflection layer structure formed on the laminated substrate;

a n-type gallium nitride clad layer, gallium nitride active layer and p-type gallium nitride clad layer deposited successively on the lower Bragg reflection layer structure;

a laser element region including an upper Bragg reflection layer structure formed over the p-type gallium nitride clad layer. Because the Bragg reflection layer structure is formed over the high-quality gallium nitride crystal, any possible deterioration of the laser characteristic due to the poor crystalline quality can be considerably suppressed.

The laminated structure may include the gallium nitride layer and the aluminum nitride thin layer on the laminated substrate, which concurrently serve as the lower Bragg reflection layer structure.

In another embodiment of the present invention, the photo electric semiconductor element may comprise:

a detector element region having successively deposited on the laminated substrate a n-type gallium nitride clad layer and a p-type gallium nitride clad layer, because it is possible to increase the sensitivity and also to improve the device characteristics such as increase of the operating frequency to a high band region due to a reduction in traps.

BRIEF DESCRIPTION OF THE DRAWINGS

The present invention will become readily understood from the following description of preferred embodiments made with reference to the accompanying drawings, in which like parts are designated by like reference numeral and in which:

FIG. 8 is an sectional view of ridge-type laser diode according to the fourth embodiment of the present invention.

DETAILED DESCRIPTION OF THE EMBODIMENTS (First Embodiment)

Figure 1:
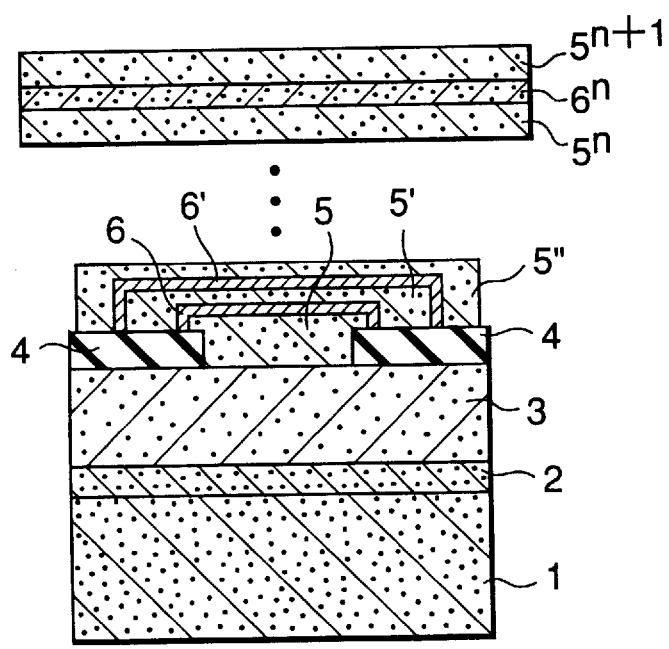
FIG. 1 is a sectional view showing a high-quality GaN substrate according to the first embodiment of the present invention.

Referring now to FIG. 1 which illustrates, in a sectional representation, a GaN selectively grown layer in which a layer structure including a plurality of GaN layers $5, 5', \ldots,$ and $5^{n+1}$ and a plurality of thin AlN layers $6, 6', \ldots,$ and $6^n$ each intervening between the neighboring GaN layers are selectively grown on a substrate 1 partly covered by a dielectric, such as $SiO_2$ film 4. The substrate 1 is a sapphire (0001) substrate on which a low temperature buffer (LTB) layer 2 and a GaN layer 3 are deposited, one on the other, and including a dielectric mask made of, for example, $SiO_2$ film 4 for selective growth and also a GaN layer grown in an opening.

The thin AlN layer is formed between each neighboring pair of GaN layers at predetermined intervals. The inclusion of the AlN layers is effective to dramatically change the mode of growth and also to increase the flatness of a surface of each GaN layer as will be discussed in detail later, thereby considerably reducing the density of defects in the GaN layers as compared with the prior art growing method.

Figure 2A:
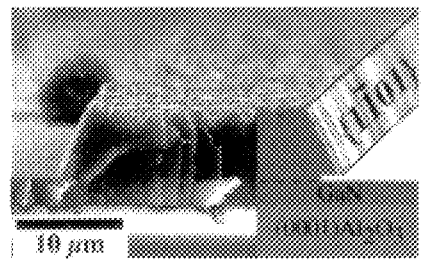
FIG. 2A is a sectional SEM picture of a GaN selectively grown layer according to the first embodiment of the present invention.
Figure 2B:
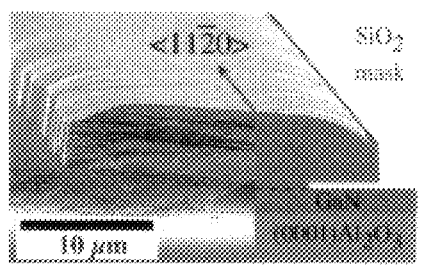
FIG. 2B is a sectional SEM picture of a conventional GaN layer.

The surface condition of each GaN layer formed by the use of the prior art selective growing method and the surface condition of each GaN layer formed by the use of the selective growing method according to the embodiment of the present invention are shown in FIGS. 2A and 2B, respectively, for comparison purpose. The substrate employed was a sapphire (0001) substrate on which, after the GaN layer had been formed, a SiO$_2$ mask was formed for selective growth of the GaN layer (or the AlN layer).

Figure 2C:
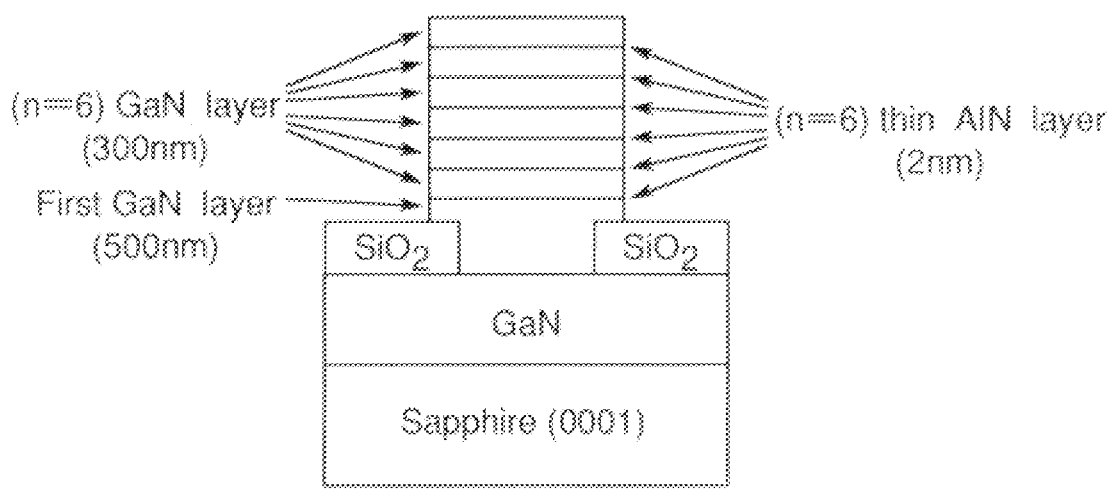
FIG. 2C is a schematic sectional view of a GaN selectively grown layer according to the first embodiment of the present invention.

FIG. 2A is a scanning electron microscope (SEM) photo of the conventional GaN layers having no AlN layer intervening between the neighboring GaN layers and FIG. 2B is a SEM photo showing the structure in which, after the thin GaN layer of 500 nm had been formed, the thin AlN layers of 2 nm and the GaN layer of 300 nm are alternately formed over the 500 nm GaN layer. FIG. 2C is a schematic diagram depicting the GaN layers shown in FIG. 2B. While the growth thickness on the substrate is nominal, the reality is that because of influences brought about by migration, the film thickness tends to differ from the nominal thickness as the growth proceeds.

As FIGS. 2A and 2B make it clear, each GaN layer formed by the prior art selective growing method shown in FIG. 2A has resulted in a rough morphology on the surface, whereas the surface of the GaN layers including the thin AlN layers formed according to the selective growing method of the present invention has exhibited a favorable flatness. The reason therefor appears that the length of migration of Ga on the surface of the AlN layer is so large that the formation of the AlN layers at the predetermined intervals during the growth of the GaN layers results in flattening of the GaN layer. Also, the increase of the migration length also results in an increase of the growth of the GaN layer overlaying the SiO$_2$ mask. This is clearly illustrated by the fact that the GaN layers so formed spread laterally in FIG. 2B further than that shown in FIG. 2A.

The use of the selective growing method of the present invention makes it possible to improve the crystalline quality of the GaN layers in addition to flattening of the surface. To qualitatively examine the improvement in crystalline quality, a sample shown in FIG. 2B was etched in a molten KOH solution which is a selective etching solution for defects, to determine the EPD (Etch Pit Density).

Figure 3:
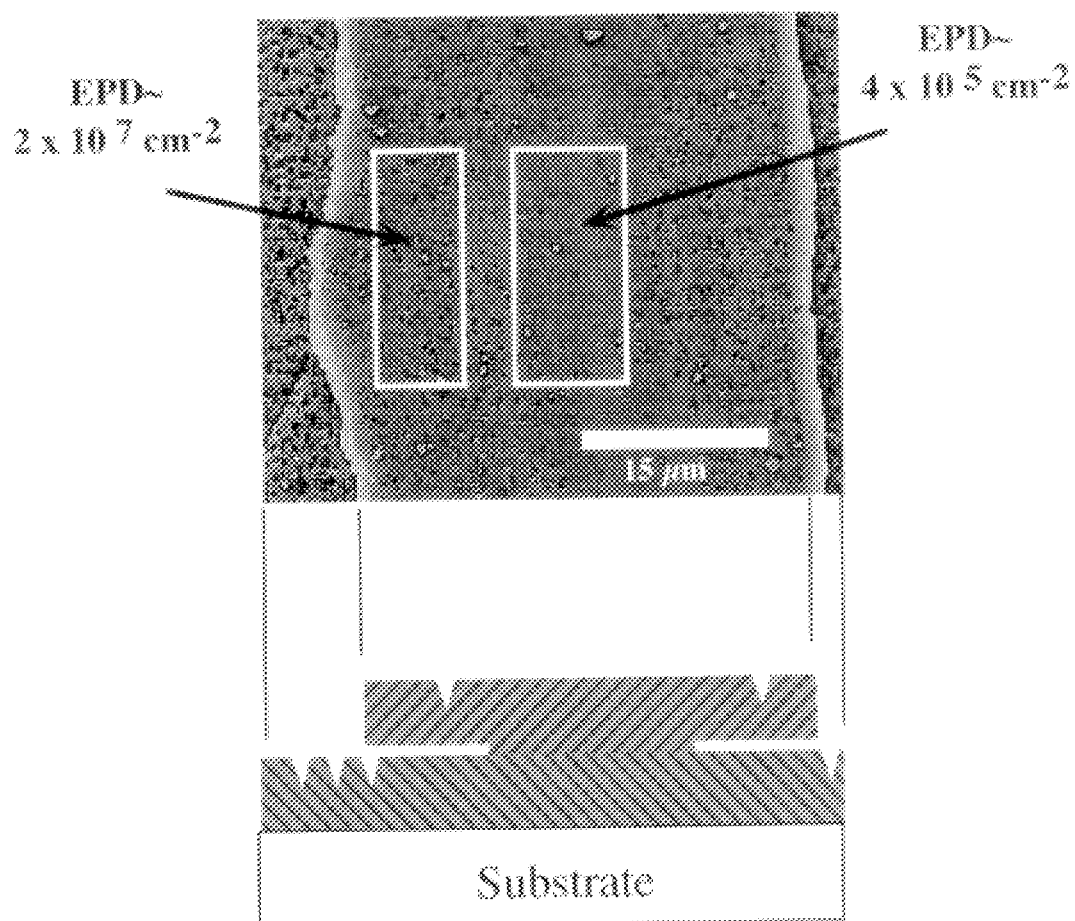
FIG. 3 is a SEM picture of EPD in a GaN layer according to the first embodiment of the present invention.

FIG. 3 is a SEM photo showing a surface condition of the sample of FIG. 2B which has been etched in the manner described above. The EPD was found to be about $4 \times 10^5 cm^{-2}$. In the SEM photo shown in FIG. 3, the surface of the sample was observed from a slant direction and the sample was etched (at 450° C. for 30 seconds) in the molten KOH solution to determine the EPD. The SiO$_2$ selective growth mask was completely removed by etching to allow the underlying GaN layer to be exposed to the outside.

Thus, since the EPD when formed according to the prior art method is generally about $4 \times 10^8 cm^{-2}$, the use of the selective growing method of the present invention is effective to decrease the EPD by a factor of 1000.

Figure 4:
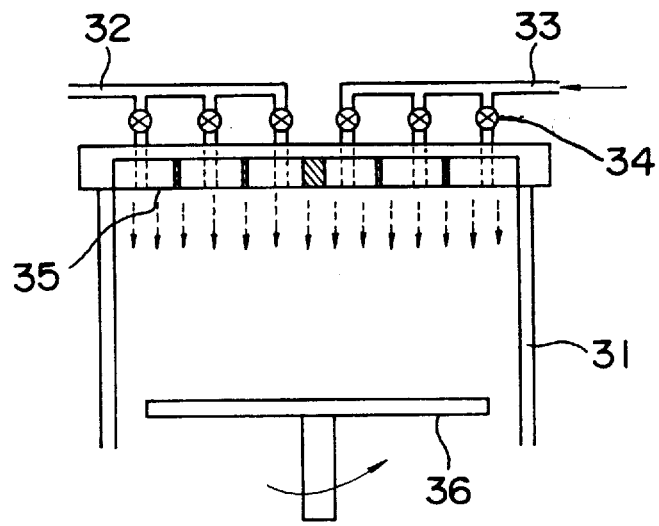
FIG. 4 is an MOCVD reactor according to the first embodiment of the present invention.

In the illustrated embodiment, the GaN layers are formed by a selective growing method utilizing an MOCVD process. An MOCVD apparatus used therefor is shown in FIG. 4. In the MOCVD apparatus shown in FIG. 4, all gases are supplied from the top. Specifically, nitrogen gas is supplied through a nitrogen source manifold 32 separate from a supply manifold 33 through which a Group III source gas is supplied. The flow of each gas can be optimized by adjusting a respective regulating needle valve 34 and, separate therefrom, a predetermined flow of hydrogen is supplied from a screen 35. The gases so supplied reach a substrate mounted on a wafer carrier 36 and react with the substrate to form a desired semiconductor layer. To increase uniformity of the semiconductor layer, the wafer carrier is rotated at a high speed (for example, 500 to 1,000 rpm). The pressure inside a reactor is preferably within the range of 76 to 200 Torr.

In the practice of the illustrated embodiment of the present invention, high-quality GaN can be obtained by a high temperature growth at 1030° C. on a thin GaN buffer layer. Such a GaN buffer layer is preferably deposited at 540° C. at 200 Torrs pressure, ammonium gas (NH$_3$), and trimethyl gallium.

It is to be noted that any method associated with any one of the MBE method and the CBE method can be employed in the present invention.

Figure 5:
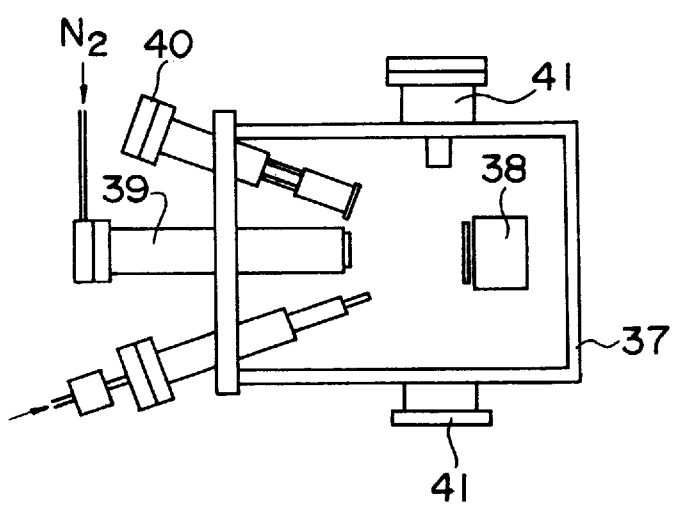
FIG. 5 is an MBE chamber according to the first embodiment of the present invention.

FIG. 5 illustrates an MBE apparatus equipped with an ECR plasma source. In a method in which to MBE apparatus is employed, a substrate is first transferred into a high-vacuum MBE chamber 37 and the substrate 38 is, after having been annealed typically at 900° C. with an N$_2$ of a gas exposure or a high-temperature thermal annealing technique, exposed to N$_2$ and is, therefore, nitrided by nitrogen gas supplied through a gas injector 39 while the substrate is typically heated to a temperature of 400° C.

Then, a low-temperature buffer layer of either GaN or AlN is deposited by introduction of a Ga source beam. The Ga source beam referred to above consist of Ga atoms from a MBE furnace 40 or an organic metal Ga precursor such as, for example, triethyl gallium (TEG) or TMG, and they can be introduced by any suitable gas injector.

Thereafter, a high-quality GaN layer is deposited while the substrate temperature is typically within the range of 600° to 860° C.

An advantage of the method of the present invention lies in that by the use of an electron diffraction (RHEED) 41 the crystalline quality can be analyzed in situ during the growth.

The most preferred source of nitrogen is precracked N$_2$, NH$_3$ or the like and, on the other hand, the precursor of Ga is often used in the form of TMG or TEG. In addition, nitrogen radicals or atoms can be formed by an ECR plasma, microwave activation of N$_2$ or thermal cracking off NH$_3$.

The selective growing method according to the embodiment of the present invention will now be described with particular reference to FIG. 1.

A sapphire substrate 1 having a crystalline orientation (0001) is placed on a susceptor for crystalline growth. The crystalline orientation of the sapphire substrate may be other than (0001).

Then, residual impurities are cleaned from the surface of the substrate. For this surface cleaning method, treatment with hydrogen atoms in the MBE apparatus or a high temperature treatment in the MOCVD apparatus is preferred.

Then, a buffer layer 2 having a thickness within the range of 2 to 500 nm is deposited on the sapphire substrate 1 at a substrate temperature of 200° to 1,000° C. The buffer layer may be a GaN layer or may be a multi-layered compound of a material expressed by the following formula:

$$Ga_xAl_yIn_zN \qquad (I)$$

wherein $0<x\leq 1, 0\leq y<1, 0\leq z<1$, and $x+y+z=1$. The purpose of the buffer layer is to form a nucleation layer on the substrate.

Then, a high-temperature GaN layer is grown at a temperature higher than 900° C. in the case of the MOCVD process or at a temperature higher than 600° C. in the case of the MBE process. The film thickness is typically about 2 μm, but may be within the range of 2 nm to 6 μm. It is to be noted that in place of the GaN layer, any other material expressed by the following formula can be employed:

$$Ga_xAl_yIn_zN \qquad (I)$$

wherein $0 < x \leq 1$, $0 \leq y < 1$, $0 \leq z < 1$, and $x+y+z=1$.

After having been cooled, the sample is removed from the reactor and a thin dielectric layer 4 is deposited on it. The dielectric material may be $SiO_2$, $SiN_x$, $SiO_xN_x$ or any other known dielectric material. The film thickness is typically 100 nm, but may be within the range of 10 to 500 nm.

Thereafter, the dielectric layer is partially removed by the use of a lithographic technique and wet etching to leave an opening. The opening left by removing that portion of the dielectric layer may have a shape chosen in consideration of the structure of a semiconductor device. This opening may be in the form of a stripe shape having a width within the range of 200 nm to 50 μm and a length within a range of 200 nm to several millimeters. The stripe-shaped opening may be oriented in any desired direction and may not be limited to a specific direction.

The sample so prepared is again loaded in the reactor and is heated to a growth temperature at which selective growth of the GaN layer takes place. The selective growth starts with a growth of a thin GaN layer (2 to 1,000 nm) or a thin AlN layer (1 to 200 nm) on the GaN layer 3 which has been masked by a dielectric material such as, for example, $SiO_2$ film 4.

After this growth, the GaN layers (2 to 1,000 nm) 5' and so on and the AlN layers (1 to 200 nm) 6' and so on are alternately deposited. The total number of combinations of GaN/AlN may be chosen within the range of 1 to 200.

The GaN layer 5 when grown to a film thickness of about 200 nm will have its surface formed with surface irregularities and, therefore, before the surface irregularities are formed on the surface of the GaN layer 5, the thin AlN layer 5 has to be formed. Since on the surface of the AlN layer Ga generally migrates considerably, a flat GaN layer is formed on the AlN layer. Accordingly, if before the surface irregularities are formed on the GaN layer the AlN layer is sandwiched, it is possible to form the GaN layer while the surface flatness is maintained. The AlN layer may have a film thickness generally within the range of 1 to 50 nm although the use of at least one AlN layer may be considered sufficient to obtain the effect of the above described migration.

Also, by inserting the AlN layers into the GaN layers at the predetermined intervals, it is possible to enclose screw dislocations, occurring in the GaN layer immediately below the AlN layer, within the GaN layer. In other words, since the AlN layer is formed over the GaN layer, the dislocations occurring within the GaN layer can be looped, rendering it to be difficult for them to propagate over the AlN layer and, consequently, the density of dislocations within the GaN layer formed in the outermost surface can be reduced.

From the foregoing, it has now become clear that the outermost GaN layer $5^{n+1}$ grown by the use of the growing method of the foregoing embodiment of the present invention has an optimized surface morphology as compared with the surface of the GaN layer grown by the prior art method and also has a crystalline quality in which the density of defects such as screw dislocations is minimized.

It is, however, to be noted that in place of the GaN layers 5, 5', . . . and $5^{n+1}$, different GaN-type compound layers expressed by the following formula can be equally employed:

$$Ga_xAl_yIn_zN \qquad (I)$$

wherein $0 < x \leq 1$, $0 \leq y < 1$, $0 \leq z < 1$, and $x+y+z=1$.

Also, in place of the thin AlN layers 6, 6', . . . and $6^n$, AlN-type thin layers prepared from a composition containing a relatively high quantity of Al, which is expressed by the following formula may be employed:

$$Al_xGa_{1-x}N \qquad (II)$$

wherein $0.7 < x \leq 1$.

(Second Embodiment)

In the first embodiment of the present invention, sapphire has been employed for the substrate 1. However, in place of the sapphire, any other material such as, for example, Si, GaAs, GaN, SiC or a heat-resistant glass (a glass of a kind which does not soften at the temperature at which the selective growth of the GaN layer takes place) may be employed for the substrate 1.

Such a substrate is advantageous in many aspects, for example, inexpensive and easy to handle.

Even where any of those alternative materials is employed for the substrate 1, the step of crystalline growth is substantially similar to that described in connection with the foregoing embodiment and the substrate can have an electrical conductivity if appropriate impurities are added.

It is to be noted that even where Si, GaAs, or the like is employed for the substrate, crystal orientation of the substrate is not limited to a particular direction as is the case with the sapphire substrate.

(Third Embodiment)

Figure 6:
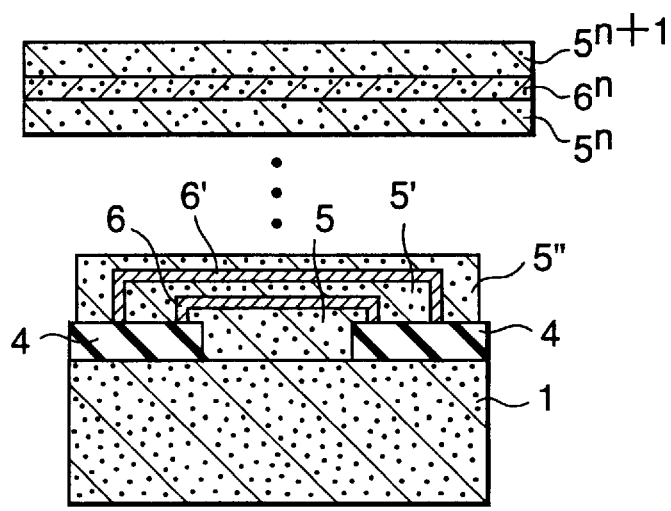
FIG. 6 is a sectional view showing a GaN substrate according to the third embodiment of the present invention.
Figure 7:
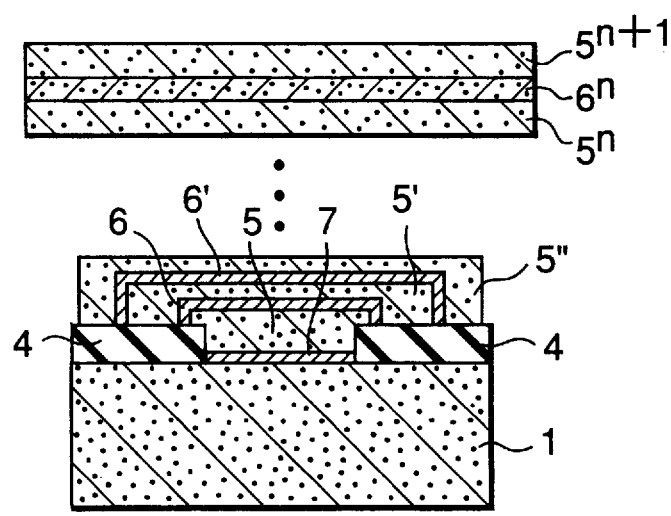
FIG. 7 is a sectional view showing a GaN substrate according to the third embodiment of the present invention.

FIGS. 6 and 7 illustrate cross-sectional representations of GaN layers formed according to a third embodiment of the present invention.

This third embodiment of the present invention differs from the embodiment shown in FIG. 1 in that as shown in FIGS. 6 and 7, neither the low temperature buffer layer 2 nor the GaN layer 3, such as shown in FIG. 1, is formed and, instead, the dielectric mask 4 is formed directly on the substrate 1, followed by successive lamination of the GaN layer 5 and the AlN layer 6. Also, while in FIG. 6 the GaN layer is first formed directly on the substrate 1, in FIG. 7 the AlN layer 7 is formed directly on the substrate 1.

Thus, even though neither of the buffer layer 2 nor the GaN layer 3 is formed, it is possible to form the GaN layer $5^{n+1}$ having a minimized deterioration in surface morphology and also having a minimized density of defects as is the case with the foregoing embodiments of the present invention.

It is to be noted that, in place of the GaN layer 5, 5', . . . and $5^{n+1}$, different GaN-type compound layers expressed by the following formula can be equally employed:

$$Ga_xAl_yIn_zN \qquad (I)$$

wherein $0 < x \leq 1$, $0 \leq y < 1$, $0 \leq z < 1$, and $x+y+z=1$.

Also, in place of the thin AlN layers 6, 6', . . . and $6^n$, AlN-type thin layers prepared from a composition containing a relatively high quantity of Al, which is expressed by the following formula may be employed:

$$Al_xGa_{1-x}N \qquad (II)$$

wherein $0.7 < x \leq 1$.

(Fourth Embodiment)

FIGS. 8A to 8D illustrate the sequence of manufacture of a ridge-type (stripe-type) laser on the GaN layer according to the present invention.

In the first place, as shown in FIG. 8A, an n-type GaN clad layer 3, an active layer 9, and a p-type GaN clad layer 10 are successively deposited on the high-quality GaN compound layer formed in the manner as described in connection with the first embodiment of the present invention. The active layer 9 includes a multi-quantum well of InGaN/AlGaN layers for emission of a laser beam, sandwiched between the GaN clad layers 8 and 10, to form a p-n junction of a double-hetero (DH) structure.

Subsequently, as shown in FIG. 8B, in order to form the ridge structure, the n-type GaN clad layer 8, the active layer 9 and the p-type GaN clad layer 10 are etched by the use of any known lithographic technique and a dry etching technique.

Then, as shown in FIG. 8C, after a protective film 13 of, for example, $SiO_2$ has been deposited on a side wall of the ridge, an opening is formed by the use of a lithographic technique and etching.

Finally, as shown in FIG. 8D, metal contacts 11 and 12 are formed and a mirror facet (not shown) is formed for defining a cavity.

In this way, by forming a laser structure on the high-quality GaN layer formed according to the present invention, it is possible to improve the device characteristic, to increase lifetime, and to lower the threshold current density and power consumption.

It is to be noted that each of the layers 8 to 10 may be prepared from different GaN-type compound layers expressed by the following formula can be equally employed:

$$Ga_xAl_yIn_zN \qquad (I)$$

wherein $0<x\leq1$, $0\leq y<1$, $0\leq z<1$, and $x+y+z=1$.

Also, in place of the high-quality GaN layer shown in connection with the first embodiment of the present invention, the substrate and the structure both shown in connection with the second embodiment of the present invention can be equally employed.

(Fifth Embodiment)

Figure 9:
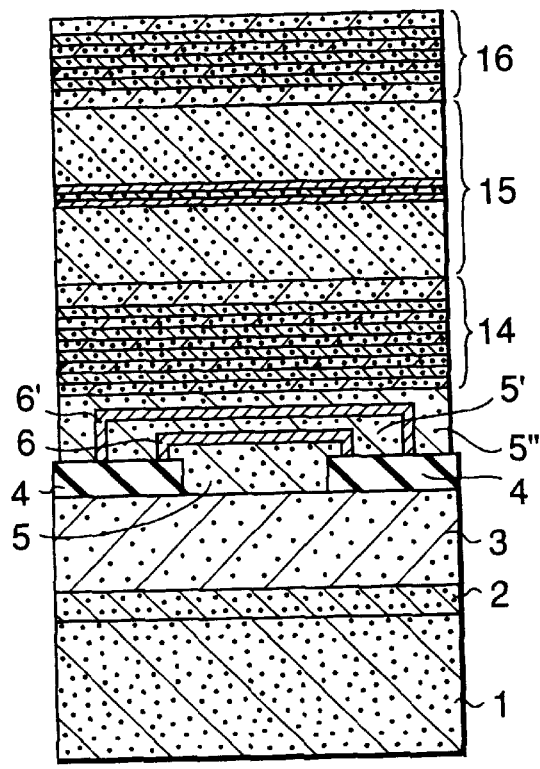
FIG. 9 is a sectional view of VSCEL according to the fifth embodiment of the present invention.

FIG. 9 illustrates a cross-sectional view of the high-quality GaN layer applied to a surface emitting laser (VSCEL: Vertical Cavity Surface Emitting Laser).

In this embodiment, a lower Bragg reflection layer structure 14, an active layer and a cavity 15, and an upper Bragg reflection layer structure 16 are successively deposited on the high-quality GaN layer shown in connection with the first embodiment of the present invention.

The lower Bragg reflection layer structure 14 is in the form of a multi-layered structure of AlN/AlGaN layers each having a film thickness within the range of 20 to 50 nm, depending on the composition and the wavelength of light emitted, and is operable to reflect the laser beam partly back into the cavity.

The cavity and active layer 15 are of a laser structure including a p-n junction and InGaN/AlGaN quantum well layers. The upper Bragg reflection layer structure 113 is in the form of a layer of nitride compound crystals or a multi-layered structure such as, for example, $SiO_2/MgO$ or $SiO_2/ZrO_2$. More preferably, the Bragg reflection layer structure 14 is made up of AlN/GaN multi-layered structures 5, 6 . . . .

It is to be noted that although J. Redwings et al. have published the use of $Al_{0.4}Ga_{0.6}N/Al_{0.12}Ga_{0.88}N$ (39.7 nm/37.2 nm) of 30 cycles for the Bragg reflection layer structure 14, no favorable characteristic is obtained because of poor crystalline quality.

In the present invention, however, since the Bragg reflection layer structure 14 is formed over the high-quality GaN crystal, any possible deterioration of the laser characteristic due to the poor crystalline quality can be considerably suppressed.

(Sixth Embodiment)

Figure 10:
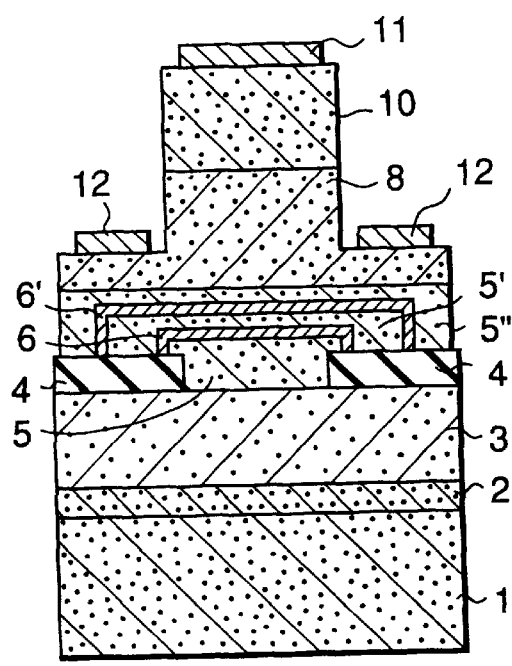
FIG. 10 is a sectional view of a UV-detector according to the sixth embodiment of the present invention.

FIG. 10 illustrates a cross-sectional representation of the high-quality GaN layer applied to an ultraviolet (UV) light detector.

The crystal quality of the device plays an important role in the underwater communication, in the ground-to-space communication at high frequency operation, or in a UV detector such as a combustion detector. In other words, the performance of the UV detector referred to above can be improved by the use of the high-quality GaN layer of the present invention.

The UV detector according to this embodiment of the present invention includes, as shown in FIG. 10, an n-GaN layer (or n-$Al_xGa_{1-x}N$ ($0\leq x\leq1$) layer) 8 and a p-GaN layer (or n-$Al_xGa_{1-x}N$ ($0\leq x\leq1$) layer) 10 both formed on the high-quality GaN layer with a transparent contact 1 and another contact 12 being formed on the p-GaN layer 10 and the n-GaN layer 8, respectively.

Figure 11:
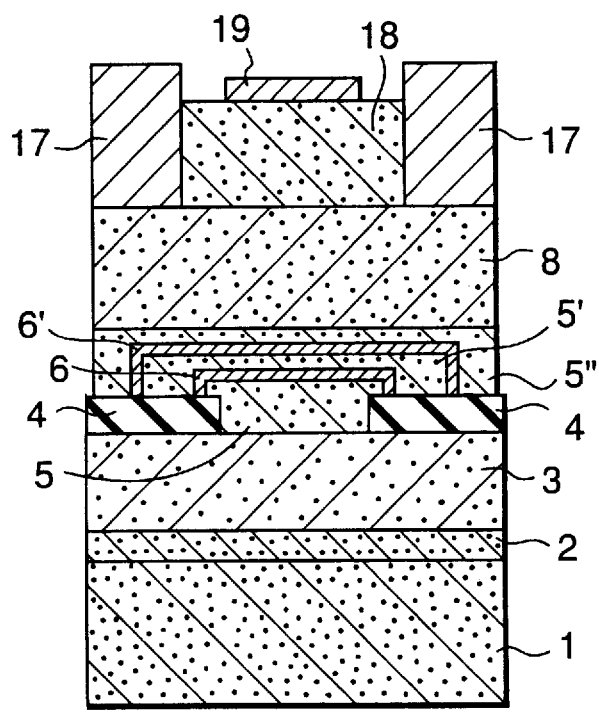
FIG. 11 is a sectional view of HFET according to the sixth and seventh embodiment of the present invention.
Figure 12A:
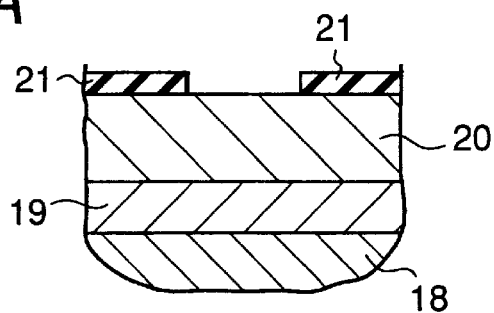
FIG. 12 shows each step of conventional GaN selective growth.
Figure 12B:
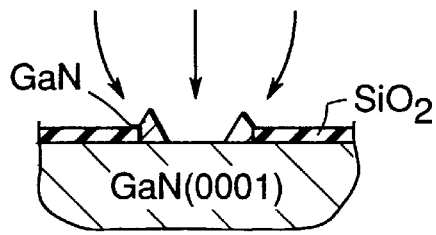
Figure 12C:
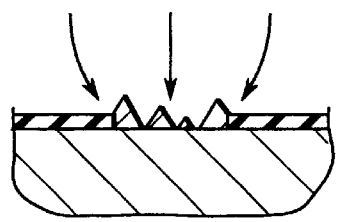
Figure 12D:
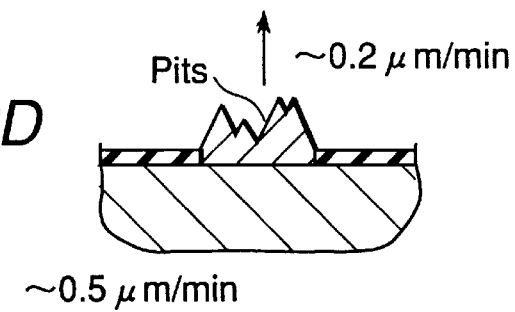
Figure 12E:
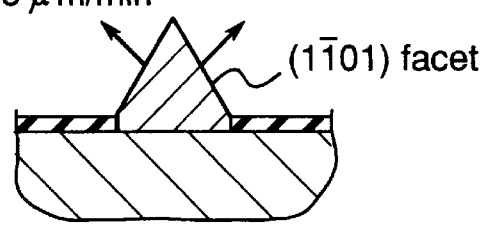
Figure 12F:
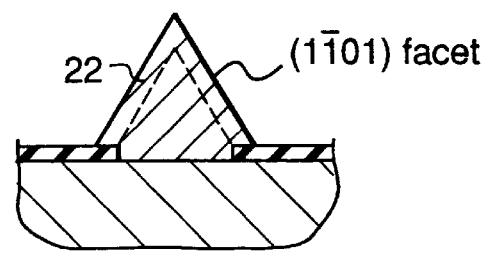

FIG. 11 shows a cross-sectional representation of the high-quality GaN layer applied to a GaN/AlGaN HFET that can be generally used as UV photodetector device.

The GaN/AlGaN HFET is formed by depositing successively on the high-quality GaN layer 5" of the present invention, an undoped GaN layer 8, an n-AlGaN barrier layer 18 doped with $n=4\times10^{18}$ cm$^{-3}$ and having a film thickness of 25 nm, a metal gate 19 of 0.2 $\mu$m in gate length, and a source, a drain contact 17.

In this GaN/AlGaN HFET, electron-hole pairs are generated inside the GaN layer 8 with the electrons and the holes migrating respectively towards a channel and the substrate.

Accordingly, by the use of the high-quality GaN crystal of the present invention, it is possible to increase the sensitivity and also to improve the device characteristics such as increasing of the operating frequency to a high band region due to a reduction in the number of traps.

(Seventh Embodiment)

The seventh embodiment of the present invention lies in application of the high-quality GaN layer of the present invention to an HFET, a cross-sectional structure of which is shown in FIG. 11 and is similar to that shown in connection with the sixth embodiment of the present invention. The crystal quality of the GaN layer is an important factor because it affects the high frequency characteristic of the transistor and, particularly, application to a microwave element.

Accordingly, the formation of the high-quality GaN layer of the present invention in the HFET is effective to considerably improve the transistor characteristic of the HFET.

It is to be noted that even any other electronic device such as HBT, HEMT or FET can have an improved element characteristic if formed on the high-quality GaN layer of the present invention. For example, the lifetime of carriers can be increased, the operating frequency can be increased and loss of the electrical power can be reduced.

It is to be noted that in any one of the fourth to seventh embodiments of the present invention, the substrate and the structure shown in connection with any one of the second and third embodiments of the present invention can be employed in place of the high-quality GaN layer shown in connection with the first embodiment of the present invention.

From the foregoing full description of the various preferred embodiments of the present invention, it has now become clear that with the selective growing method to form the gallium nitride layer of the present invention, the aluminum nitride thin layer effective to increase the length of migration of the Ga atoms as compared with that of the gallium nitride layer is suitably interposed between each neighboring gallium nitride layers which are selectively grown to thereby accomplish a flattening of the gallium nitride layer immediately above the aluminum nitride thin layer. Accordingly, not only can the surface irregularities present at the surface of the substrate laminated with the gallium nitride layer be reduced, but also it is possible a GaN-type layer excellent in surface flatness.

Also, since the aluminum nitride thin layer serves to trap the screw dislocations occurring in the gallium nitride layer immediately beneath the aluminum nitride thin layer to thereby avoid propagation to the gallium nitride layer immediately thereabove, the consequence is that the defect density at the surface of the substrate laminated with the GaN layer can be reduced.

In addition, the use of the high-quality gallium nitride layer of the present invention is effective to increase the yield of manufacture of devices to be formed on the substrate laminated with the gallium nitride layer because the substrate laminated with the gallium nitride layer has an excellent surface crystal quality.

Yet, because of the reduced defect density of the substrate laminated with the gallium nitride layer, it is also possible to increase the characteristics and the reliability of elements formed on the substrate.

Although the present invention has been described in connection with the preferred embodiments thereof, it should be noted that various changes and modifications are apparent to those skilled in the art. Accordingly, such changes and modifications so far as encompassed by the appended claims are to be understood as included within the scope of the present invention.

What is claimed is:

1. A substrate laminated with a high-quality gallium nitride layer comprising:

a substrate;

a dielectric mask on the substrate and having a surface partially exposed at an opening;

a plurality of gallium nitride selectively grown layers, each grown on a portion of the substrate encompassed by the opening, each said gallium nitride selectively grown layer having a composition expressed by the chemical formula:

$$Ga_xAl_yIn_zN \qquad (I)$$

wherein $0<x\leq1$, $0\leq y<1$, $0\leq z<1$, and $x+Y+z=1$; and an aluminum nitride thin layer interposed between pairs of neighboring gallium nitride selectively grown layers, said aluminum nitride layer having a composition expressed by the formula:

$$Al_xGa_{1-x}N \qquad (II)$$

wherein $0.7<x\leq1$.

2. The substrate as claimed in claim 1, further comprising a buffer layer and gallium nitride layer formed on the substrate prior to the formation of the dielectric mask.

3. The substrate as claimed in claim 1, wherein the aluminum nitride thin layer contacts the substrate or the gallium nitride layer contacts substrate.

4. A semiconductor device which comprises:

the substrate as claimed in claim 1;

a photoelectric semiconductor element, an electronic semiconductor element or an electro-optical integrated semiconductor element.

5. The semiconductor device as claimed in claim 4, wherein a photo electric semiconductor element comprises:

a laser element region having successively deposited on the laminated substrate a stripe-shaped n-type gallium nitride clad layer, a stripe-shaped gallium nitride active layer and a p-type gallium nitride clad layer.

6. The semiconductor device as claimed in claim 4, wherein a photo electric semiconductor element comprises:

a lower Bragg reflection layer structure formed on the laminated substrate;

a n-type gallium nitride clad layer, gallium nitride active layer and p-type gallium nitride clad layer deposited successively on the lower Bragg reflection layer structure;

a laser element region including an upper Bragg reflection layer structure formed over the p-type gallium nitride clad layer.

7. The semiconductor device as claimed in claim 6, wherein a laminated structure including the gallium nitride layer and the aluminum nitride thin layer on the laminated substrate concurrently serves as the lower Bragg reflection layer structure.

8. The semiconductor device as claimed in claim 4, wherein a photoelectric semiconductor element comprises:

a detector element region having successively deposited on the laminated substrate a n-type gallium nitride clad layer and a p-type gallium nitride clad layer.

* * * * *